(12) United States Patent
Kim et al.

(10) Patent No.: US 8,492,459 B2
(45) Date of Patent: Jul. 23, 2013

(54) INK COMPOSITION AND METHOD OF FORMING A PATTERN USING THE SAME

(75) Inventors: Jinwuk Kim, Gyeonggi-do (KR); Kibeom Lee, Gyeonggi-do (KR); Byonghoo Kim, Gyeonggi-do (KR); Seunghyup Shin, Seoul (KR); Junyong Song, Gyeonggi-do (KR); Myoungsoo Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 296 days.

(21) Appl. No.: 12/314,622

(22) Filed: Dec. 12, 2008

(65) Prior Publication Data
US 2009/0176936 A1 Jul. 9, 2009

(30) Foreign Application Priority Data

Dec. 13, 2007 (KR) .................. 10-2007-0129813
Apr. 8, 2008 (KR) .................. 10-2008-0032791

(51) Int. Cl.
*C09D 11/00* (2006.01)
(52) U.S. Cl.
USPC ............ 523/161; 525/50; 525/480; 525/55; 525/451; 101/483
(58) Field of Classification Search
USPC .................................................. 523/160, 161
See application file for complete search history.

(56) References Cited

U.S. PATENT DOCUMENTS

| | | | | |
|---|---|---|---|---|
| 5,110,706 A | * | 5/1992 | Yumoto et al. | 430/191 |
| 6,641,972 B2 | * | 11/2003 | Misumi et al. | 430/192 |
| 6,730,149 B2 | * | 5/2004 | Arita et al. | 106/31.27 |
| 2003/0087179 A1 | * | 5/2003 | Iwasaki | 430/166 |
| 2005/0064321 A1 | | 3/2005 | Kang et al. | 430/270.1 |
| 2007/0048662 A1 | * | 3/2007 | Park et al. | 430/270.1 |

FOREIGN PATENT DOCUMENTS

| | | |
|---|---|---|
| CN | 1564966 | 1/2005 |
| JP | 2003-307850 | 10/2003 |
| JP | 2005-507509 | 3/2005 |
| WO | WO 03/038525 * | 5/2003 |
| WO | WO 03/038252 | 8/2003 |

OTHER PUBLICATIONS

An Office Action Report from the Chinese Patent Office dated Apr. 8, 2011 in a counterpart foreign application.
Office Action of Japanese Patent Application No. 2008-317534 dated Nov. 8, 2011.

\* cited by examiner

*Primary Examiner* — Doris Lee
(74) *Attorney, Agent, or Firm* — Morgan, Lewis & Bockius LLP

(57) ABSTRACT

There are provided an ink composition for imprint lithography and roll-printing, which is applied to the formation of a pattern using imprint lithography and roll-printing to play the role of a pattern support, can increase the accuracy of pattern formation by minimizing the occurrence of a swelling phenomenon caused by the ink composition, and can improve yield and the efficiency of the process by increasing the transfer rate of a pattern, and a method of forming a pattern of a display or semiconductor by using the same.

8 Claims, 3 Drawing Sheets

INK COMPOSITION AND METHOD OF FORMING A PATTERN USING THE SAME

This application claims the benefit of Korean Patent Application Nos. 10-2007-0129813 field on Dec. 13, 2007 and 10-2008-0032791 filed on Apr. 8, 2008 both of which are hereby incorporated by reference in their entirety.

BACKGROUND OF THE INVENTION

1. Field of the Invention

This document relates to an ink composition and a method of forming a pattern using the same.

2. Related Art

In general, a process for forming a fine pattern applied in information storage, small-sized sensors, optical crystal and optical elements, microelectromechanical devices, display devices, displays, and semiconductors is a photolithographic method for forming a fine pattern by using light.

In the related art photolithographic method, a circuit line-width or a pattern line-width is dependent on a wavelength of the light used in the exposure process. Considering the current technological level, it is very difficult to form a fine pattern of 70 nm or smaller on a substrate by using a photolithographic method due to the interference of light. Further, as patterns become hyperfine, high-priced equipments, such as exposure equipments, are require, and this leads to an increase in initial investment cost and a sharp rise in the price of a high-resolution mask, thereby decreasing efficiency. The problem of having to use high-priced equipments ultimately serves as another factor of cost increase.

Besides, a considerable processing time is needed because exposure, post-exposure baking, development, post-development baking, etching, cleaning, etc. should be carried out whenever a pattern is formed. Also, a photoprocess needs to be repeated a plurality of times, thus to deteriorate productivity.

As a method to solve these problems, an imprint lithographic method and a roll-printing technique were proposed. The imprint lithographic method, which was invented by Stephen Chou et. al., Princeton University, USA, is a method for forming a fine pattern by manufacturing a necessary shape on the surface of an organic material or polymer having a relatively high strength and then imprinting the material into another material for patterning.

More specifically, the imprint lithographic method is a technique for forming a pattern by preparing an inorganic or polymer mold on which a desired pattern is formed, facing the mold with a curable composition coated on a metal film or an organic film and thermosetting or photocuring the mold and the curable composition. Such an imprint lithographic method has an advantage over the related art photolithographic method in terms of process simplification and fine pattern formation. Regarding the roll-printing technique, Korean Patent Application No. 2006-0005482 (Laid-Open Patent Publication No. 10-2007-76292) specifically discloses a roll-printing apparatus and a method of manufacturing a display device by using the same. It is mentioned that the roll-printing method is applicable to FEDs (field emission displays), organic EL (electroluminescent) devices, and PDPs (plasma display panels) and the manufacturing process is simplified, and it is disclosed that the accuracy of a pattern is guaranteed even after repeated printing.

In the roll-printing technique, a pattern is directly transferred to a substrate on which a fine pattern is to be formed by using a blanket and a cliché instead of a high-resolution mask used to form a pattern in the related art photolithography. Such a roll-printing technique has improved the deformability with a mold by an alignment using a blanket serving as a stamp, and has enhanced productivity and working efficiency by employing a thermosetting process. Further, this technique is suggested as an alternative way to substantially reduce a complex process that is performed through various steps, such as exposure of photolithography, development and so on, and incidental process expenses resulting from the complexness of the process.

However, if an ink composition with high flowability and evaporation rate is used upon formation of a fine pattern by using the related art imprint technique and roll-printing technique, the ink composition soaks into the blanket, which is a blanket, thereby causing contamination of the blanket. This leads to an increase in process standby time and a reduction of the number of times of use in the use of the blanket.

Moreover, when a cleaning operation is carried out by physical contact in order to remove impurities on the ink composition generated by the contamination of the blanket, the surface is easily damaged by friction. Also, when an imprint or roll-printing process is carried out in a state that the ink composition of the blanket is not removed, a fine pattern of the ink composition is wrongly formed on a side of the substrate to be formed, or excessive quality defects occur. Therefore, there is a limit to continuous transfer of a fine pattern, and there is a difficulty in increasing the accuracy of a fine pattern.

SUMMARY OF THE INVENTION

An aspect of this document is to provide an ink composition, comprising: a) 5 to 45 parts by weight of polymer resin; b) 5 to 45 parts by weight of a tackifier; and c) 50 to 90 parts by weight of an organic solvent.

Another aspect of this document is to provide an ink composition, which is used in an imprint lithographic process and roll-printing process for transferring a pattern on a substrate by bringing an ink composition into contact with a blanket having a pattern formed thereon, wherein the ink composition comprises a polymer resin, a tackifier, and an organic solvent, the blanket having a swelling ratio after 24 hours of 0 to 5% relative to the ink composition.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1:
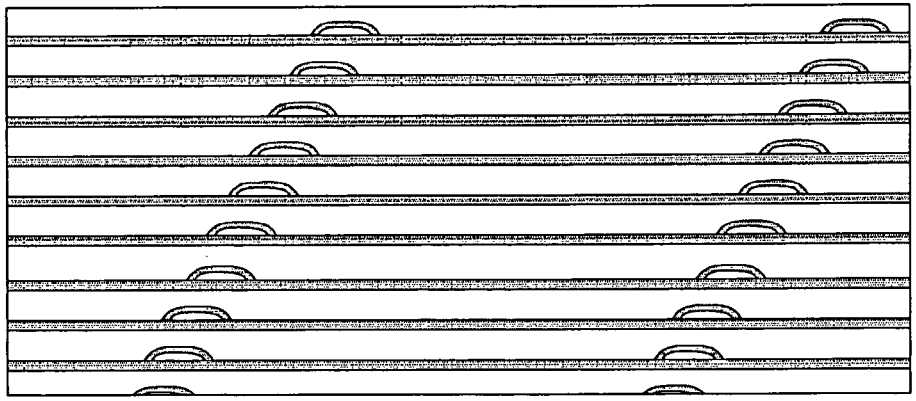
FIGS. 1 and 2 are drawings showing of the surface of a fine pattern which is formed by using an ink composition manufactured according to one embodiment of the present invention.

Reference will now be made in detail embodiments of the invention examples of which are illustrated in the accompanying drawings.

Hereinafter, concrete embodiments according to the present invention will be described with reference to the accompanying drawings.

The ink composition according to the present invention comprises: a) 5 to 45 parts by weight of polymer resin; b) 5 to 45 parts by weight of a tackifier; and c) 50 to 90 parts by weight of an organic solvent. The ink composition has excellent pattern-forming performance as well as the role of a pattern support by adding a tackifier for increasing viscosity and helping to maintain tackiness, and can improve yield and the efficiency of the process by increasing the transfer rate of a pattern.

In the ink composition of the present invention, the a) polymer resin may be a novolac resin, an acrylic resin or the like used in a typical ink composition. The novolac resin may be a polymer synthesized by reacting an aromatic alcohol including meta cresol, para cresol, 2,3,5-trimethyl phenol, 2,3-xylene and 3,5-xylene with formaldehyde or paraformaldehyde. The acrylic resin is obtained by polymerization of an unsaturated carboxyl acid, an aromatic monomer, an acrylic monomer, and the like.

The polymer resin has a molecular weight preferably of 2,000 to 4,000 more preferably of 2,000 to 15,000.

The polymer resin has preferably 5 to 45 parts by weight, more preferably 7 to 12.5 parts by weight, with respect to a total of 100 parts by weight of the composition. Within the above range, the role of a pattern support can be provided, and improvement in yield and in the efficiency of the process can be achieved by increasing the transfer rate of a pattern.

Further, in the ink composition of the present invention, the b) tackifier increases the viscosity of the ink composition, helps to maintain tackiness, and increases the deformability with imprinting and roll-printing. Also, the role of a pattern support can be provided, and improvement in yield and in the efficiency of the process can be achieved by increasing the transfer rate of a pattern.

As concrete examples of the tackifier, butylated hydroxyanisole, 2,6-di-tert-butyl-4-hydroxymethylphenol, butylated hydroxytoluene, propyl gallate, lauryl gallate, octyl gallate, 2,4,5-trihydroxybutyrophenone, tert-butylhydroquinone, phenols such as 3-aminophenol, 4-aminophenol, 4-methoxyphenol, 2,3,5-trimethylphenol, 2,4-dimethylphenol, poly(4-vinylphenol), 4-bromophenol and the like, ethers such as ethylvinylether, poly(methylvinylether), poly(isobutylvinylether) and the like, poly-(p-hydroxy)styrene, 1,1-bis(4-hydroxyphenyl)decane, 4,4-[1-[4-[1-(1,4-hydroxyphenyl)-1-methylethyl]phenyl]ethylidene]bisphenol, 4,4-[2-hydroxyphenyl]methylene]bis[2,6-dimethylphenol], urethane acrylate having an average molecular weight of 1,00 to 1,500 and urethane oligomer can be used solely or as a mixture of two or more of them.

The tackifier is contained in a range of preferably 5 to 45 parts by weight, more preferably 7 to 12.5 parts by weight, in the ink composition of the present invention.

Within the above range, the tackiness of the ink composition and the deformability with imprinting and roll-printing are increased, and the role of a pattern support can be provided, and improvement in yield and in the efficiency of the process can be achieved by increasing the transfer rate of a pattern.

Further, in the ink composition of the present invention, the c) organic solvent is preferably the one capable of easily dissolving the polymer resin, the tackifier, and an additive such as a visible compound that is additionally usable if necessary.

Concretely, as the organic solvent, alcohols such as methanol, ethanol, ethylene glycol, triethylene glycol, tetraethylene glycol, propylene glycol, diethylene glycol, butanediol, benzyl alcohol, hexyl alcohol and the like; ethers such as propylene carbonate, tetrahydrofuran, methoxybenzene, 1,4-dioxane, 1-methoxy-2-propanol, methoxybenzene, dibutylether, diphenolether and the like; esters such as ethyl acetate, propyl acetate, butyl acetate, ethyl propionate, ethyl ester, butyl ester, methyl-2-hydroxyisobutyrate, 2-methoxy-1-methylethylester, 2-methoxyethanolacetate, 2-ethoxyetahnoacetate and the like; ethylene glycol alkyl ether acetates such as ethylene glycol methyl ether acetate, ethylene glycol ethyl ether acetate, and the like: ethylene glycol alkyl ether propionates such as ethylene glycol ethyl ether propionate and the like, ethylene glycol monoalkyl ethers such as ethylene glycol methyl ether, ethylene glycol ethyl ether and the like; diethylene glycol alkyl ethers such as diethylene glycol monomethyl ether, diethylene glycol monoethyl ether and the like; propylene glycol alkyl ether acetates such as propylene glycol methyl ether acetate, propylene glycol ethyl ether acetate, propylene glycol propyl ether acetate and the like; propylene glycol alkyl ether propionates such as propylene glycol methyl ether propionate, propylene glycol ethyl ether propionate, propylene glycol propyl ether propionate and the like; propylene glycol monoalkyl ethers such as propylene glycol methyl ether, propylene glycol ethyl ether, propylene glycol propyl ether, propylene glycol butyl ether and the like; dipropylene glycol alkyl ethers such as dipropylene glycol dimethyl ether, dipropylene glycol diethyl ether and the like; butylene glycol monomethyl ethers such as butylene glycol monoalkyl ether, butylene glycol monoethyl ether and the like; and dibutylene glycol alkyl ethers such as dibutylene glycol dimethyl ether, dibutylene glycol diethyl ether and the like can be used solely or as a mixture of two or more of them. Especially, it is more advantageous for pattern transfer that a mixture of two or more solvents, rather than a single solvent, is used as the organic solvent in order to improve the coating performance on a blanket.

The organic solvent is contained in a range of preferably 50 to 90 parts by weight, more preferably 70 to 80 parts by weight, in the ink composition. Within the above range, the dissolubility and the efficiency of the process can be both achieved.

The ink composition for imprint lithography and roll-printing according to the present invention composed of the above components may further comprise a surfactant or additive.

The surfactant acts to prevent ink stains or hole marks formed in the blanket and acquire a fine coating property.

The surfactant may include a silicon-based surfactant or a fluorine-based surfactant such as a perfluoroalkyl oligomer, and the content thereof is 0.01 to 3 parts by weight, preferably 0.1 to 1.5 parts by weight, with respect to a total of 100 parts by weight of the ink composition.

The additive may include an adhesive sensitizer or a visible compound.

The adhesive sensitizer is used to enhance adhesiveness to a lower layer. As the adhesive sensitizer, a general melamine-based crosslinking agent can be used. The melamine-based crosslinking agent may include a condensation product of urea and formaldehyde, a condensation product of melamine and formaldehyde, and a methylol urea alkyl ether or methylol melamine alkyl ether obtained from alcohol, etc.

Concretely, as the condensation product of urea and formaldehyde, monomethylol urea, dimethylol urea and the like can be used. As the condensation product of melamine and formaldehyde, hexamethylol melamine can be used. Besides, a partial condensation product of melamine and formaldehyde as well can be used. Further, the methylol urea alkyl ether is obtained by reacting part or the whole of the methylol group of the condensation product of urea and formaldehyde with an alcohol, and concrete examples thereof include monomethyl urea methyl ether, dimethyl urea methyl ether and the like. The methylol melamine alkyl ether is obtained by reacting part or the whole of the methylol group of the condensation product of melamine and formaldehyde with an alcohol, and concrete examples thereof include hexamethylolmelamine hexamethyl ether, hexaymethylolmelamine hexabutyl ether and the like. Moreover, a compound having a structure in which a hydrogen atom of an amino group of melamine is substituted by a hydroxymethyl group and a methoxymethyl group, and a compound having a structure in which a hydrogen atom of an amino group of melamine is substituted by a butoxymethyl group and a methoxymethyl group, and the like can also be used. Especially, it is preferred to use a methylol melamine alkyl ether.

If the adhesive sensitizer is used as the additive, it is advantageous that the content thereof is 0.01 to 5 parts by weight, preferably 0.5 to 2.5 parts by weight, with respect to a total of 100 parts by weight of the composition. Within the above range, the ink composition of the present invention has excellent adhesiveness to a lower substrate, and serves to protect a metal layer under a pattern in a subsequent etching process.

The visible compound can acquire the visibility of the ink composition by using a dye, a pigment, or a photosensitive compound, achieve excellent pattern transfer performance by dissolving with a polymer resin, and makes it easier to obtain an adhesive force to a desired substrate.

As the visible compound, diazide compounds, such as 2,3,4-trihydroxybenzophenone 1,2-naphthoquinonediazido-5-sulfonate prepared by esterifying trihydroxybenzophenone with 2-diazo-1-naphthol-5-sulfonic acid, 2,3,4,4'-tetrahydroxybenzophenone 1,2-naphthoquinonediazido-5-sulfonate prepared by esterifying tetrahydroxybenzophenone with 2-diazo-1-naphthol-5-sulfonic acid and the like, can be used solely or as a mixture thereof.

If a visible compound is used as the additive, it is advantageous that the content thereof has 0.1 to 3 parts by weight, preferably 0.5 to 2.0 parts by weight, with respect to a total of 100 parts by weight of the ink composition of the present invention.

The ink composition of the present invention containing the aforementioned components can be applied to the formation of a pattern using a well-known typical imprint process (for example, Korean Patent Laid-Open Publication No. 10-2005-0019557) and a roll-printing process (for example, Korean Patent Laid-Open Publication No. 10-2007-0076292), thus to form a pattern on a substrate.

In a concrete example, the ink composition is coated with a thickness of 0.5 to 10 μm by an appropriate method, such as spin coating, roller coating, and slit coating. Then, in the imprint process, after the ink composition is brought into contact with a blanket stamp having a pattern of a desired shape, a pattern can be transferred on a substrate, such as a silicon substrate, a ceramic substrate, a metal layer, a polymer layer. On the other hand, in the roll-printing process, after the ink composition is brought into contact with a blanket by using a cliché having a pattern of a desired shape, a pattern can be transferred on a substrate, such as a silicon substrate, a ceramic substrate, a metal layer, a polymer layer.

Next, a photocuring process can be carried out by using ultraviolet rays, or a thermosetting process for heat treatment at a temperature of 90 to 200° C. can be carried out, or the photocuring processing and the thermosetting process can be concurrently carried out. The thermal treatment process is carried out in order to evaporate the solvent without thermally decomposing solid components of the ink composition. Generally, it is preferred to minimize the concentration of the solvent through a heat treatment process, and it is preferred to carry out the heat treatment process until an ink film having a thickness of 10 μm or less is left on the substrate. The above process increases adhesiveness and chemical resistance between the ink film and the substrate. The substrate on which the above process has been completed is treated with a corrosion solution or gas plasma to treat an exposed substrate region. At this time, an unexposed region of the substrate is protected by the ink film. After treating the substrate in this manner, a fine circuit pattern can be formed on the substrate by removing the ink film by an appropriate stripper.

Ink compositions of embodiments 1 and 2 and comparative example 1 and 2 were prepared by conducting uniform mixing according to the components and compositions shown in the following Table 1 for more than 24 hours under an ambient temperature. The unit of Table 1 is part by weight.

The polymer resin used in Table 1 is a novolac resin, the organic solvent is methanol, the surfactant is a silicon surfactant, and the additive is hexamethylolmelamine hexamethyl ether.

TABLE 1

| | classification | | | |
|---|---|---|---|---|
| | Embodiment 1 | Embodiment 2 | Comparative Example 1 | Comparative Example 2 |
| Polymer resin | 10 | 10 | 10 | 20 |
| tackifier | 10 | 10 | 10 | — |
| | Butylated hydroxyanisole | Poly-(p-hydroxy) styrene | Urethane acrylate | |
| Organic solvent | 80 | 80 | 80 | 80 |
| Surfactant | 1 | 1 | 1 | 1 |
| additive | 3 | 3 | 3 | — |

Physical properties of the ink compositions of Embodiments 1 and 2 and Comparative Examples 1 and 2 prepared in Table 1 were evaluated by the following method.

A. Fine Pattern Transfer Rate

The ink compositions of Embodiments 1 and 2 and Comparative Examples 1 and 2 were coated on a blanket with no pattern. After natural drying for 20 seconds, a fine pattern was transferred on a substrate to be formed as the blanket passes through a cliché, and the transfer rate of the pattern was shown in the following Table 2. It was clearly demonstrated that the transfer rate of the pattern is 0 to 100% depending on pattern formation within 100 cells having a size of 1×1 mm.

TABLE 2

| | classification | | | |
|---|---|---|---|---|
| | Embodiment 1 | Embodiment 2 | Comparative Example 1 | Comparative Example 2 |
| Pattern transfer rate (%) | 96 | 95 | 70 | 30 |

As shown in Table 2, it can be found that the ink compositions of Embodiments 1 and 2 using the tackifier according to the present invention showed excellent pattern transfer rate of 95% or more.

B. Pattern Formation Accuracy

The ink compositions of Embodiments 1 and 2 and Comparative Examples 1 and 2 were coated on a blanket with no pattern. After natural drying for a predetermined time, a fine pattern was transferred on a substrate to be formed as the blanket passes through a cliché. Next, the substrate on which the fine pattern was transferred was heat-treated for a predetermined time at a high temperature, and then immersed in an aluminum etching solution of 40□ for a predetermined time and dried. Next, the surface of the fine pattern was analyzed by a scanning electron microscope, and the results thereof were shown in Tables 1 to 4, respectively. Also, adhesive force between the fine pattern portion and the lower substrate was measured and shown in Table 3. The adhesive force between the fine pattern portion and the lower substrate was demonstrated to be 0 to 100% depending on degree.

Figure 2:
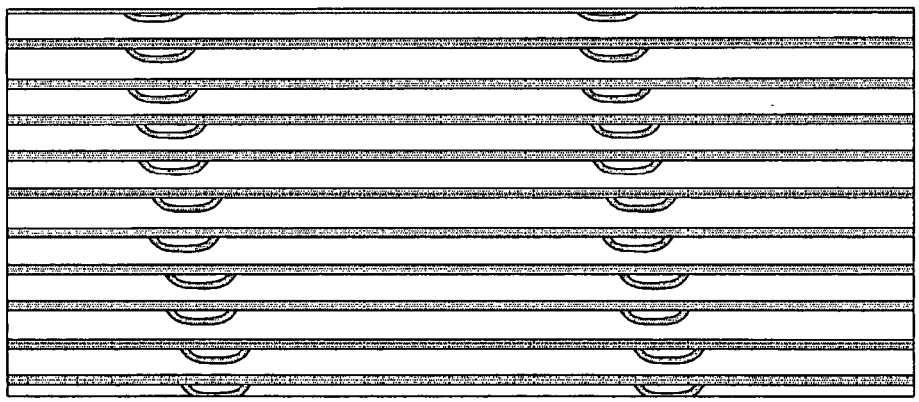
Figure 3:
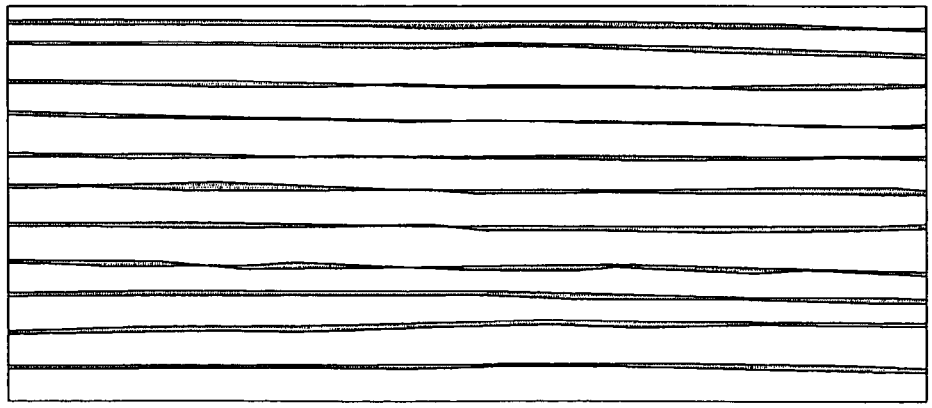
FIGS. 3 and 4 are drawings showing of the surface of a fine pattern which is formed by using an ink composition manufactured according to a comparative example.
Figure 4:
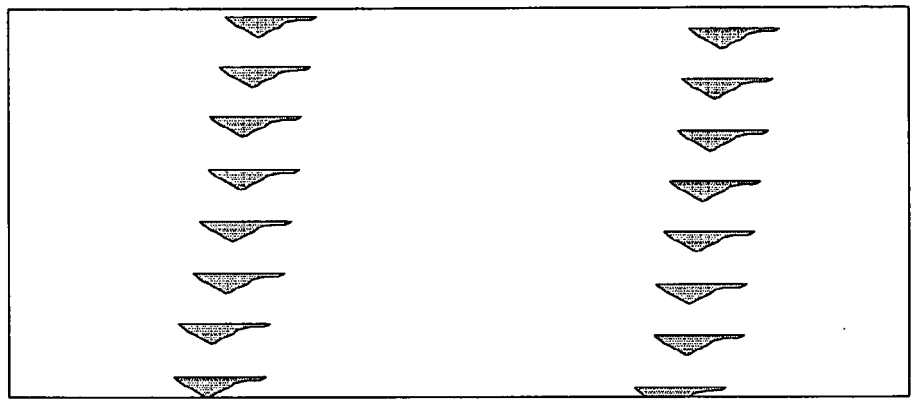

As shown in Tables 1 to 4, it can be found that the ink compositions of Embodiment 1 (FIG. 1) and Embodiment 2 (FIG. 2) according to the present invention shows excellent accuracy of pattern formation since they form a uniform pattern. On the other hand, in Comparative Examples 1 and 2, it can be found that pattern formation does not appear accurately.

TABLE 3

| | classification | | | |
|---|---|---|---|---|
| | Embodiment 1 | Embodiment 2 | Comparative Example 1 | Comparative Example 2 |
| Adhesive force (%) | 98 | 97 | 5 | 2 |

As shown in Table 3, it can be found that the ink compositions of Embodiment 1 (FIG. 1) and Embodiment 2 (FIG. 2) according to the present invention showed significantly excellent adhesive force compared to those of Comparative Examples 1 and 2.

The ink composition of the present invention is used in an imprint lithographic process and roll-printing process for transferring a pattern on a substrate by contacting an ink composition with a blanket with a pattern. The ink composition comprises a polymer resin, a tackifier, and an organic solvent. The swelling ratio after 24 hours of the blanket relative to the ink composition is 0 to 5%. Preferably, the ink composition comprises: a) 5 to 45 parts by weight of polymer resin; b) 5 to 45 parts by weight of a tackifier; and c) 50 to 90 parts by weight of an organic solvent.

The swelling ratio after 24 hours of the blanket relative to the ink composition means the ratio of difference between the initial weight of the blanket and the weight of the blanket measured after immersing the blanket for 24 hours in the ink composition, taking it out and cleaning it with methanol and the weight {swelling ratio(%)=[(weight (g) of blanket after cleaning−initial weight (g) of blanket)/initial weight (g) of blanket]×100}. The swelling ratio after 24 hours of the blanket relative to the ink composition of the present invention is 0 to 5%. Preferably, the swelling ratio after 24 hours is 0 to 4%.

In the ink composition of the present invention, the a) polymer resin may be a novolac resin, an acrylic resin or the like used in a typical ink composition. The novolac resin may be a polymer synthesized by reacting an aromatic alcohol including meta cresol, para cresol, 2,3,5-trimethyl phenol, 2,3-xylene and 3,5-xylene with formaldehyde or paraformaldehyde. The acrylic resin is obtained by polymerization of an unsaturated carboxyl acid, an aromatic monomer, an acrylic monomer, etc.

The polymer resin has a molecular weight preferably of 2,000 to 10,000 more preferably of 2,000 to 45,000.

The polymer resin has preferably 5 to 45 parts by weight, more preferably 7 to 12.5 parts by weight, with respect to a total of 100 parts by weight of the composition. Within the above range, the role of a pattern support can be provided, and improvement in yield and in the efficiency of the process can be achieved by increasing the transfer rate of a pattern.

Further, in the ink composition of the present invention, the b) tackifier increases the viscosity of the ink composition, helps to maintain tackiness, and increases the deformability with imprinting and roll-printing. Also, the role of a pattern support can be provided, and improvement in yield and in the efficiency of the process can be achieved by increasing the transfer rate of a pattern.

As concrete examples of the tackifier, butylated hydroxyanisole, 2,6-di-tert-butyl-4-hydroxymethylphenol, butylated hydroxytoluene, propyl gallate, lauryl gallate, octyl gallate, 2,4,5-trihydroxybutyrophenone, tert-butylhydroquinone, phenols such as 3-aminophenol, 4-aminophenol, 4-methoxyphenol, 2,3,5-trimethylphenol, 2,4-dimethylphenol, 2,6-dimethylphenol, poly(4-vinylphenol), 4-bromophenol and the like, ethers such as ethylvinylether, poly(methylvinylether), poly(isobutylvinylether) and the like, poly-(p-hydroxy)styrene, 1,1-bis(4-hydroxyphenyl)decane, 4,4-[1-[4-[1-(1,4-hydroxyphenyl)-1-methylethyl]phenyl]ethylidene] bisphenol, 4,4-[2-hydroxyphenyl]methylene]bis[2,6-dimethylphenol], tetrakis(methylene(3,5-di-tert-butyl-4-hydroxyhydrocinnamate))methane, 1,3,5-trimethyl-2,4,6-tris-(3,5-di-tert-butyl-4-hydroxybenzyl)benzene, tris-(3,5-di-tert-butyl-4-hydroxybenzyl)isocyanuate, octadecyl 3-(3', 5'-di-t-butyl-4-hydroxyphenyl)propionate, 2,5-bis(1,1-dimethylpropyl)-1,4-benzenediol, 1,1,3-tris(2 methyl)-4-hydroxy-5-tert-butylphenyl butane, triethyleneglycol-bis-(3-tert-butyl-4-hydroxy-5-methylphenyl)propionate, 2,2-methylenebis(4-methyl-6-(1-methylcyclohexyl)phenol), and tris(2,4-di-tert-butylphenyl)phosphate can be used solely or as a mixture of two or more of them. In addition, well-known rosin-based resins, including unmodified rosins such as gum rosins, wood rosins, and tall oil rosins, modified rosins, such as polymerized rosins disproportionated rosins, stabilized rosins, completely hydrogenated rosins, partially hydrogenated rosins, and other chemically modified rosins, modified by polymerization, disproportionation, hydrogenation, or the like of the unmodified rosins, as well as various rosin derivatives and the like, can be selected and used. As the rosin derivatives, unsaturated fatty acid modified rosin-based resins, unsaturated fatty acid modified rosin ester-based resins, rosin alcohol-based resins, and metal salts of rosin-based resins can be used.

In addition, an urethane oligomer having an average molecular weight of 1,000 to 5,000 can be used solely or as a mixture of two or more kinds thereof.

The tackifier is contained in a range of preferably 5 to 45 parts by weight, more preferably 7 to 12.5 parts by weight, in the ink composition of the present invention. Within the above range, the tackiness of the ink composition and the deformability with imprinting and roll-printing can be adjusted, and the role of a pattern support can be provided, and improvement in yield and in the efficiency of the process can be achieved by increasing the transfer rate of a pattern.

Further, in the ink composition of the present invention, the c) organic solvent is preferably the one capable of easily dissolving the polymer resin, the tackifier, and an additive such as a visible compound that is additionally usable if necessary. The swelling ratio after 24 hours of the blanket relative to the organic solvent is 0 to 5%.

Preferably, as the organic solvent, acetonitrile, glycerol, dimethyl sulfoxide, nitromethane, dimethylformamide, phenol, N-methylpyrrolidone, pyridine perfluorotributylamine, perfluorodecalin, 2-butanone, alcohols such as methanol, ethanol, ethylene glycol, triethylene glycol, tetraethylene glycol, propylene glycol, diethylene glycol, butanediol, benzyl alcohol, hexyl alcohol and the like, ethers such as propylene carbonate, tetrahydrofuran, methoxybenzene, 1,4-dioxane, 1-methoxy-2-propanol, methoxybenzene, dibutylether, diphenolether and the like, ethylene glycol monoalkyl ethers such as etylene glycol methyl ether, ethylene glycol ethyl ether and the like, diethylene glycol alkyl ethers such as diethylene glycol monomethyl ether, diethylene glycol monoethyl ether, diethylene glycol dimethyl ether, diethylene glycol methyl ethyl ether and the like, propylene glycol monoalkyl ethers such as propylene glycol methyl ether, propylene glycol butyl ether and the like, dipropylene glycol alkyl ethers such as dipropylene glycol dimethyl ether, dipropylene glycol diethyl ether and the like, butylene glycol monoalkyl ethers such as butylene glycol monoalkyl ether, butylene glycol monoethyl ether and the like, and dibutylene glycol alkyl ethers such as dibutylene glycol dimethyl ether, dibutylene glycol diethyle ether and the like can be used solely or as a mixture of two or more of them. Especially, it is more advantageous for pattern transfer that the organic solvent that a mixture of two or more solvents, rather than a single solvent, is used as the organic solvent in order to improve the coating performance on a blanket.

The organic solvent is contained in a range of preferably 50 to 90 parts by weight, more preferably 70 to 80 parts by weight, in the ink composition. Within the above range, the dissolubility and the efficiency of the process can be both achieved.

The ink composition for imprint lithography and roll-printing according to the present invention composed of the above components may further comprise a surfactant or additive.

The blanket formed with PDMS (poly dimethyl siloxane).

Ink compositions of embodiments 1 and 2 and comparative example 1 and 2 were prepared by conducting uniform mixing according to the components and compositions shown in the following Table 4 for more than 24 hours under an ambient temperature. The unit of Table 4 is g.

The polymer resin used in Table 4 is a novolac resin having an average molecular weight of 7,000, the tackifier is butylated hydroxyanisole, the surfactant is a silicon surfactant, the additive is hexamethylolmelamine hexamethyl ether, and the mixing ratio of the organic solvent is a weight ratio.

TABLE 4

| | classification | | | |
|---|---|---|---|---|
| | Embodiment 1 | Embodiment 2 | Comparative Example 1 | Comparative Example 2 |
| Polymer resin | 10 | 10 | 10 | 20 |
| tackifier | 10 | 10 | 10 | — |
| Organic solvent | 80 | 80 | 80 | 80 |
| | Acetonitrile:triethylene glycol = 9:1 | acetonitrile | Ethyl acetate:butyl acetate = 9:1 | Ethyl acetate |
| Surfactant | 1 | 1 | 1 | 1 |
| additive | 3 | 3 | 3 | 3 |

Physical properties of the ink compositions of Embodiments 1 and 2 and Comparative Examples 1 and 2 prepared in Table 1 were evaluated by the following method.

A. Swelling Ratio of Blanket and Ink Composition

A blanket was cut to a size of 50×50, completely immersed in the ink compositions of Embodiments 1 and 2 and Comparative Examples 1 and 2 for 24 hours, and cleaned with methanol. Then, the swelling ratio (%) was measured based on the ratio of initial weight to the final weight and shown in the following Table 5.

Swelling Ratio=[(weight(g) of blanket after cleaning (g)−initial weight(g) of blanket)/initial weight(g) of blanket]×100.

TABLE 5

| | Initial weight | Weight (g) after cleaning | Swelling ratio (%) |
|---|---|---|---|
| Embodiment 1 | 4.018 | 4.033 | 0.4 |
| Embodiment 2 | 3.886 | 3.898 | 0.3 |
| Comparative Example 1 | 3.985 | 4.048 | 1.6 |
| Comparative Example 2 | 3.941 | 3.995 | 1.4 |

As shown in Table 5, it can be found that the ink compositions of Embodiment 1 and Embodiment 2 according to the present invention exhibited extremely small permeation through the blanket while those of Comparative Examples 1 and 2 exhibited a serious swelling phenomenon in which the swelling ratio is 1.4 or more.

B. Fine Pattern Transfer Rate

The ink compositions of Embodiments 1 and 2 and Comparative Examples 1 and 2 were coated on a blanket with no pattern. After natural drying for 20 seconds, a fine pattern was transferred on a substrate to be formed as the blanket passes through a cliché, and the transfer rate of the pattern was shown in the following Table 6. It was clearly demonstrated that the transfer rate of the pattern is 0 to 100% depending on pattern formation within 100 cells having a size of 1×1 mm.

TABLE 6

| | classification | | | |
|---|---|---|---|---|
| | Embodiment 1 | Embodiment 2 | Comparative Example 1 | Comparative Example 2 |
| Pattern transfer rate (%) | 98 | 96 | 92 | 85 |

As shown in Table 6, it can be found that the ink compositions of Embodiments 1 and 2 according to the present invention showed excellent pattern transfer rate of 96% or more.

B. Pattern Formation Accuracy

The ink compositions of Embodiments 1 and 2 and Comparative Examples 1 and 2 were coated on a blanket with no pattern. After natural drying for a predetermined time, a fine pattern was transferred on a substrate to be formed as the blanket passes through a cliché. Next, the substrate on which the fine pattern was transferred was heat-treated, and then immersed in an aluminum etching solution of 40□ for a predetermined time, taken out, and dried. Next, the surface of the fine pattern was analyzed by a scanning electron microscope, and the results thereof were shown in Tables 5 to 8, respectively.

Figure 5:
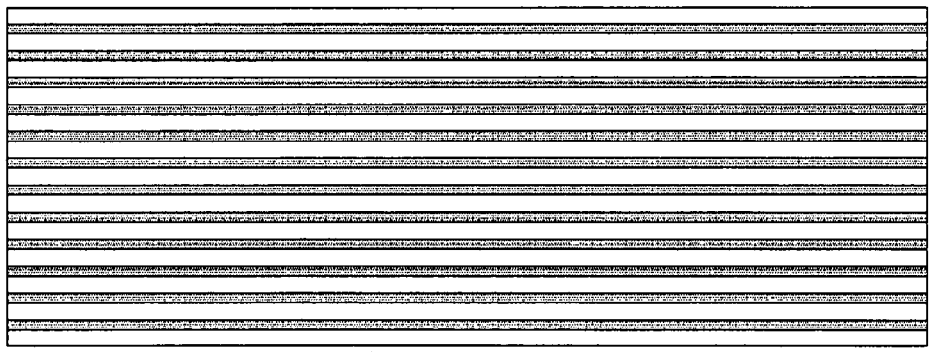
FIGS. 5 and 6 are drawings showing of the surface of a fine pattern which is formed by using an ink composition manufactured according to another embodiment of the present invention.
Figure 6:
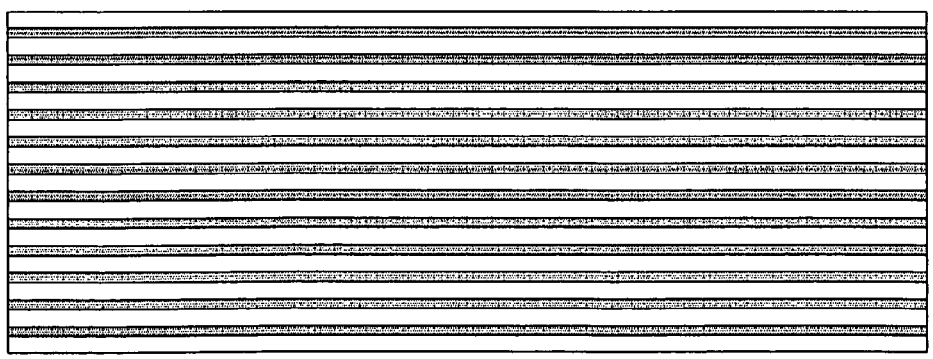
Figure 7:
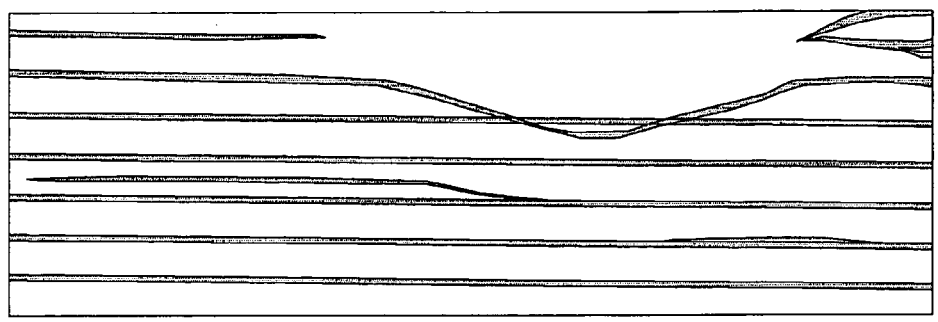
FIGS. 7 and 8 are drawings showing of the surface of a fine pattern which is formed by using an ink composition manufactured according to a comparative example.
Figure 8:
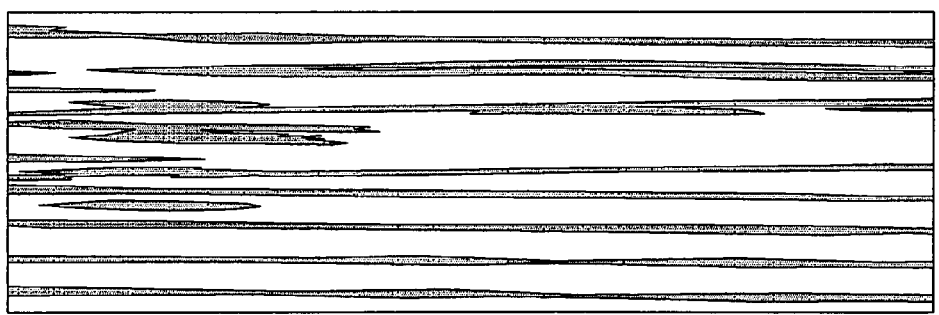

As shown in Tables 5 to 8, it can be found that the ink compositions of Embodiment 1 (FIG. 5) and Embodiment 2 (FIG. 6) according to the present invention shows excellent accuracy of pattern formation since they form a uniform pattern. On the other hand, in Comparative Examples 1 (FIG. 7) and 2 (FIG. 8), it can be found that pattern formation does not appear accurately.

D. Waiting Time of Ink Composition

The ink compositions of Embodiments 1 and 2 and Comparative Examples 1 and 2 were coated on a blanket with no pattern. After natural drying, a fine pattern was transferred on a substrate to be formed as the blanket passes through a cliché. Next, the substrate on which the fine pattern was transferred was heat-treated, and then immersed in an aluminum etching solution of 40☐ for a predetermined time, taken out, and dried. Next, the waiting time was measured based on the transfer rate at which a pattern is formed, and shown in the following Table 7. The unit of Table 7 is %.

TABLE 7

|  | Time (sec) | | | | | | | | | |
| --- | --- | --- | --- | --- | --- | --- | --- | --- | --- | --- |
|  | 0 | 5 | 10 | 15 | 20 | 25 | 30 | 40 | 90 | 150 |
| Embodiment 1 | 94 | 95 | 98 | 97 | 94 | 95 | 92 | 91 | 90 | 0 |
| Embodiment 2 | 94 | 95 | 93 | 96 | 95 | 94 | 93 | 91 | 90 | 0 |
| Comparative Example 1 | 82 | 93 | 95 | 94 | 57 | 42 | 30 | 0 |  |  |
| Comparative Example 2 | 80 | 82 | 84 | 85 | 35 | 20 | 11 | 0 |  |  |

As shown in Table 7, it can be found that when the waiting time of the ink compositions of Embodiments 1 and 2 according to the present invention was less than 90 seconds, they showed excellent pattern transfer rate. On the other hand, it can be found that when the waiting time of the ink compositions of Comparative Examples 1 and 2 according to the present invention was than 30 seconds, they showed pattern transfer rates of 30% and 11%, respectively, and no transfer was conducted after 40 seconds. Accordingly, it can be found that the waiting time of the ink compositions of the present invention were significantly improved.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112 (6).

What is claimed is:

1. An ink composition, which is used in an imprint lithographic process and roll-printing process for transferring a pattern on a substrate by bringing an ink composition into contact with a blanket having a pattern formed thereon,
   wherein the ink composition comprising:
   a) 5 to 45 parts by weight of polymer resin;
   b) 5 to 45 parts by weight of a tackifier; and
   c) 50 to 90 parts by weight of an organic solvent,
   the blanket having a swelling ratio after 24 hours of 0 to 5% relative to the ink composition,
   wherein the polymer resin is one or more selected from the group consisting of a novolac resin, an acrylic resin, and a mixture thereof,
   wherein the ink composition further comprising 0.01 to 3 parts by weight of a boron-based surfactant with respect to a total of 100 parts by weight of the ink composition,
   wherein the ink composition further comprises 0.01 to 5 parts by weight of an adhesive sensitizer that is a melamine-based cross-linking agent, and
   wherein the tackifier is one or more selected from the group consisting of butylated hydroxyanisole, 2,6-di-tert-butyl-4-hydroxymethylphenol, butylated hydroxytoluene, propyl gallate, lauryl gallate, octyl gallate, 2,4,5-trihydroxybutyprophenone, tert-butylhydroquinone;
   phenols selected from the group consisting of methoxyphenol, 2,3,5-trimethylphenol, 2,4-dimethylphenol, 2,6-dimethylphenol, poly(4-vinylphenol), and 4-bromophenol;
   ethers selected from the group consisting of ethylvinylether, poly(methylvinylether), and poly(isobutylvinylether);
   poly-(p-hydroxy)styrene, 1,1-bis(4-hydroxyphenyl)decane, tetrakis(methylene(3,5-di-tert-butyl-4-hydroxyhydrocinnamate))methane, 1,3,5-trimethyl-2,4,6-tris-(3,5-di-tert-butyl-4-hydroxybenzyl)benzene, tris-(3,5-di-tert-butyl-4-hydroxybenzyl)isocyanuate, octadecyl 3-(3',5'-di-t-butyl-4-hydroxyphenyl)propionate, 2,5-bis (1,1-dimethylpropyl)-1,4-benzenediol, 1,1,3-tris(2-methyl)-4-hydroxy-5-tert-butylphenyl butane, triethylene-bis-(3-tert-butyl-4-hydroxy-5-methylphenyl) propionate, 2,2-methylenebis(4-methyl-6-(1-methylcyclohexyl)phenol), tris(2,4-di-tert-putylphenyl) phosphate;
   unmodified rosins selected from the group consisting of gum rosins, wood rosins, and tall oil rosins;
   modified rosins selected from the group consisting of stabilized rosins, completely hydrogenated rosins, and partially hydrogenated rosins modified by polymerization, disproportionation, or hydrogenation; unsaturated fatty acid modified rosin-based resins, unsaturated fatty acid modified rosin ester-based resins, rosin alcohol-based resins, metal salts of rosin-based resins, and
   an urethane oligomer having an average molecular weight of 1,000 to 5,000.

2. The ink composition of claim 1, wherein the organic solvent is selected from one or more of the group consisting of acetonitrile, methanol, ethanol, propylene carbonated, glycerol, dimethyl sulfoxide, nitromethane, dimethylformamide, phenol, N-methylpyrrolidone, pyridine perfluorotributylamine, perfluorodecalin, 2-butanone, triethylene glycol, and tetraethylene glycol.

3. The ink composition of claim 1, further comprising 0.01 to 5 parts by weight of an adhesive sensitizer or 0.01 to 3 parts by weight of a visible compound with respect to a total of 100 parts by weight of the ink composition.

4. An ink composition, comprising:
   a) 5 to 45 parts by weight of polymer resin;
   b) 5 to 45 parts by weight of a tackifier; and
   c) 50 to 90 parts by weight of an organic solvent,
   wherein the polymer resin is one or more selected from the group consisting of a novolac resin, an acrylic resin, and a mixture thereof,
   wherein the ink composition further comprising 0.01 to 3 parts by weight of a boron-based surfactant with respect to a total of 100 parts by weight of the ink composition, wherein the ink composition further comprises 0.01 to 5 parts by weight of an adhesive sensitizer that is a melamine-based cross-linking agent, and wherein the tackifier is one or more selected from the group consisting of butylated hydroxyanisole, 2,6-di-tert-butyl-4-hydroxymethylphenol, butylated hydroxytoluene, propyl gallate, lauryl gallate, octyl gallate, 2,4,5-trihydroxybutyrophenone, tert-butylhydroquinone, 4-methoxyphenol, 2,3,5-trimethylphenol, 2,4-dimethylphenol, poly(4-vinylphenol), 4-bromophenol, ethylvinylether, poly(methylvinylether), poly(isobutylvinylether), poly-(p-hydroxy)styrene, 1,1-bis(4-hydroxyphenyl)decane and urethane acrylate having an average molecular weight of 100 to 1,500 and urethane oligomer.

5. The ink composition of claim 4, wherein the ink composition is used to form a pattern by using imprint lithography or roll-printing.

6. The ink composition of claim 4, wherein the organic solvent is one or more selected from the group consisting of:
alcohols selected from the group consisting of methanol, ethanol, ethylene glycol, triethylene glycol, tetraethylene glycol, propylene glycol, diethylene glycol, butanediol, benzyl alcohol, and hexyl alcohol;
ethers selected from the group consisting of propylene carbonate, tetrahydrofuran, methoxybenzene, 1,4-dioxane, 1-methoxy-2-propanol, methoxybenzene, dibutylether, and diphenylether;
esters selected from the group consisting of ethyl acetate, propyl acetate, butyl acetate, ethyl propione, ethyl ester, butyl ester, methyl-2-hydroxyisobutyrate, 2-methoxy-1-methylethylester, 2-methoxyethanolacetate, and 2-ethoxyethanoacetate;
ethylene glycol alkyl ether acetates selected from the group consisting of ethylene glycol methyl ether acetate, and ethylene glycol ethyl ether acetate;
an ethylene glycol alkyl ether propionate that is ethylene glycol ethyl ether propionate;
ethylene glycol monoalkyl ethers selected from the group consisting of ethylene glycol methyl ether, and ethylene glycol ethyl ether;
diethylene glycol alkyl ethers selected from the group consisting of diethylene glycol monomethyl ether, and diethylene glycol monoethyl ether;
propylene glycol alkyl ether acetates selected from the group consisting of propylene glycol methyl ether acetate, propylene glycol ethyl ether acetate, and propylene glycol propyl ether acetate;
propylene glycol alkyl ether propionates selected from the group consisting of propylene glycol methyl ether propionate, propylene glycol ethyl ether propionate, and propylene glycol propyl ether propionate;
propylene glycol monoalkyl ethers selected from the group consisting of propylene glycol methyl ether, propylene glycol ethyl ether, propylene glycol propyl ether, and propylene glycol butyl ether;
dipropylene glycol alkyl ethers selected from the group consisting of dipropylene glycol dimethyl ether, and dipropylene glycol diethyl ether;
butylene glycol monomethyl ethers selected from the group consisting of butylene glycol monomethyl ether, and butylene glycol monoethyl ether; and
dibutylene glycol alkyl ethers selected from the group consisting of dibutylene glycol dimethyl ether, and dibutylene glycol diethyl ether.

7. The ink composition of claim 4, further comprising 0.01 to 8 parts by weight of an adhesive sensitizer or visible compound with respect to a total of 100 parts by weight of the ink composition.

8. A method of forming a pattern by using the ink composition of claim 4.

* * * * *